(12) United States Patent
Saimoto et al.

(10) Patent No.: US 6,730,595 B2
(45) Date of Patent: May 4, 2004

(54) PROTECTING METHOD FOR SEMICONDUCTOR WAFER AND SURFACE PROTECTING ADHESIVE FILM FOR SEMICONDUCTOR WAFER USED IN SAID METHOD

(75) Inventors: Yoshihisa Saimoto, Aichi (JP); Yasuhisa Fujii, Chiba (JP); Makoto Kataoka, Aichi (JP); Kentaro Hirai, Miyagi (JP); Hideki Fukumoto, Aichi (JP); Takanobu Koshimizu, Aichi (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 10/003,227

(22) Filed: Dec. 6, 2001

(65) Prior Publication Data

US 2002/0106868 A1 Aug. 8, 2002

(30) Foreign Application Priority Data

Dec. 12, 2000 (JP) ........................... 2000-376926

(51) Int. Cl.$^7$ ............................................. H01L 21/44
(52) U.S. Cl. ........................................ 438/654; 438/118
(58) Field of Search ........................ 438/118, 654, 438/758, 704, 959

(56) References Cited

U.S. PATENT DOCUMENTS

| | | | |
|---|---|---|---|
| 5,656,552 A | * | 8/1997 | Hudak et al. ............... 438/15 |
| 6,114,753 A | * | 9/2000 | Nagai et al. ............... 257/668 |
| 6,551,676 B1 | * | 4/2003 | Yamakawa et al. ......... 428/40.1 |

FOREIGN PATENT DOCUMENTS

| | | | |
|---|---|---|---|
| JP | 6302629 | 10/1994 | |
| JP | 10-242086 | * 9/1998 | ......... H01L/21/301 |

\* cited by examiner

*Primary Examiner*—Amir Zarabian
*Assistant Examiner*—Pamela Perkins
(74) *Attorney, Agent, or Firm*—Burns, Doane, Swecker & Mathis, LLP

(57) ABSTRACT

This invention aims to provide a protecting method for a semiconductor wafer which can prevent breakage of a semiconductor wafer even when a semiconductor wafer is thinned to a thickness of 200 μm or less, and a surface protecting adhesive film for a semiconductor wafer used in the protecting method. According to this invention, there is provided a protecting method for a semiconductor wafer comprising a first step of adhering a surface protecting adhesive film for a semiconductor wafer to a circuit-formed surface of the semiconductor wafer, a second step of processing a non-circuit-formed surface of the semiconductor wafer and a third step of adhering a bonding film for die bonding to the non-circuit-formed surface of the semiconductor wafer, characterized in that the third step is performed without peeling the surface protecting adhesive film for the semiconductor wafer, and an adhesive film in which an adhesive layer is formed on one surface of a substrate film at least one layer of which is made of a resin having a melting point of 200° C. or more is used, and a surface protecting adhesive film for a semiconductor wafer used in the protecting method.

5 Claims, No Drawings

PROTECTING METHOD FOR SEMICONDUCTOR WAFER AND SURFACE PROTECTING ADHESIVE FILM FOR SEMICONDUCTOR WAFER USED IN SAID METHOD

FIELD OF THE INVENTION

This invention relates to a protecting method for a semiconductor wafer and a surface protecting adhesive film for a semiconductor waver used in said method. More specifically, it relates to a protecting method for a semiconductor wafer which is useful to prevent breakage of a semiconductor wafer in a step of thinning a semiconductor wafer and which can improve productivity, and a surface protecting adhesive film for a semiconductor wafer used in said method.

BACKGROUND OF THE INVENTION

A step of processing a semiconductor wafer comprises a step of adhering a surface protecting adhesive film for a semiconductor wafer to a circuit-formed surface of the semiconductor wafer, a step of processing a non-circuit-formed surface of the semiconductor wafer, a step of peeling the surface protecting adhesive film for the semiconductor wafer, a dicing step of dividing and cutting the semiconductor wafer, a die bonding step of bonding the divided semiconductor chip to a lead frame, then a molding step of sealing the semiconductor chip with a resin for protecting the outer portion, and the like.

In the die bonding step, a method in which a resin paste as a die bonding material is supplied to a lead frame and a semiconductor chip is put thereon for bonding has been so far mostly used. However, when the resin paste is used, it is hard to uniformly coat the same on the lead frame. Accordingly, there are problems that voids are generated in curing the bonding layer, chip crack is generated, and so forth.

For improving a non-uniform coating property which is a defect of the resin paste as the die bonding material and rationalizing the overall step, Japanese Patent Laid-Open No. 302,629/1994 discloses a method in which a bonding film for die bonding is used in a die bonding step. This method is a method in which after a step of adhering a bonding film for die bonding to a non-circuit-formed surface of a semiconductor wafer, a die bonding step of adhering the semiconductor wafer to which the bonding film for die bonding is fixed on a dicing tape and dividing and cutting the same and a step of peeling the dicing tape, a step of die-bonding the semiconductor chip to a lead frame is performed.

This method is a method in which prior to conducing the dicing step, the bonding film for die bonding is heat-adhered to the non-circuit-formed surface of the semiconductor wafer having a thickness of approximately 300 μm at 150 to 180° C. using a roll, the semiconductor wafer with the bonding agent adhered is stuck to a dicing tape and divided and cut into the semiconductor chip with the bonding agent, and the semiconductor chip with the bonding agent adhered is then peeled from the dicing tape and hot-pressed on the lead frame. This method, however, involves serious problems that when the non-circuit-formed surface of the semiconductor wafer is processed to further thin the semiconductor wafer, especially to less than 200 μm, the semiconductor wafer is broken with a pressure of a roll in adhering the bonding film for die bonding unless a surface protecting adhesive film for a semiconductor wafer is adhered, and so forth.

In recent years, thinning of a semiconductor chip has been in high demand, and a chip having a thickness of 30 to 100 μm has been required. Consequently, a protecting method for a semiconductor wafer by which a bonding film for die bonding can be adhered without breaking even the thus-thinned semiconductor wafer has been in demand.

Disclosure of the Invention

This invention aims to provide, in view of the foregoing problems, a protecting method for a semiconductor wafer which can prevent breakage of a semiconductor wafer even when a semiconductor wafer is thinned to a thickness of 200 μm or less, and a surface protecting adhesive film for a semiconductor wafer used in the protecting method.

The present inventors have assiduously conducted investigations, and have consequently found that the foregoing problems can be solved such that in performing a series of steps of adhering a surface protecting adhesive film for a semiconductor wafer to a circuit-formed surface of the semiconductor wafer, processing a non-circuit-formed surface of the semiconductor wafer and then adhering a bonding film for die bonding to the non-circuit-formed surface of the semiconductor wafer, the bonding film for die bonding is adhered to the non-circuit-formed surface of the semiconductor wafer in a state where the surface protecting adhesive film for the semiconductor wafer is adhered to the circuit-formed surface of the semiconductor wafer and a surface protecting adhesive film for a semiconductor wafer in which an adhesive layer is formed on one surface of a substrate film at least one layer of which is made of a resin having a melting point of 200° C. or more is used. This finding has led to the completion of the invention.

That is, the first aspect of this invention is a protecting method for a semiconductor wafer comprising a first step of adhering a surface protecting adhesive film for a semiconductor wafer to a circuit-formed surface of the semiconductor wafer, a second step of processing a non-circuit-formed surface of the semiconductor wafer and a third step of adhering a bonding film for die bonding to the non-circuit-formed surface of the semiconductor wafer, characterized in that the third step is performed without peeling the surface protecting adhesive film for the semiconductor wafer and a surface protecting adhesive film for a semiconductor wafer in which an adhesive layer having a storage elastic modulus at 150° C. of at least $1 \times 10^5$ Pa and a thickness of 3 to 100 μm is formed on one surface of a substrate film at least one layer of which is made of a resin having a melting point of 200° C. or more is used.

The characteristic features of the first aspect of this invention are that in a series of the steps from the adhesion of the surface protecting adhesive film for the semiconductor wafer to the circuit-formed surface of the semiconductor wafer to the peeling thereof, the step of adhering the bonding film for die bonding to the non-circuit-formed surface of the semiconductor wafer is performed subsequently to the step of processing the non-circuit-formed surface of the semiconductor wafer in a state where the surface protecting adhesive film for the semiconductor wafer is adhered to the circuit-formed surface of the semiconductor wafer, and that the adhesive film in which the adhesive layer is formed on one surface of the substrate film at least one layer of which is made of the resin having the melting point of 200° C. or more is used as the surface protecting adhesive film for the semiconductor wafer used in these steps.

Further, the second aspect of this invention is a surface protecting adhesive film for a semiconductor wafer used in the protecting method for the semiconductor wafer according to the first aspect, and it is a surface protecting adhesive film for a semiconductor wafer suitably used to produce a thin semiconductor wafer, in which an adhesive layer having a storage elastic modulus at 150° C. of at least $1 \times 10^5$ Pa and a thickness of 3 to 100 µm is formed on one surface of a substrate film at least one layer of which is made of a resin having a melting point of 200° C. or more and which has a thickness of 50 to 350 µm.

According to this invention, breakage, contamination and the like of the semiconductor wafer in the foregoing series of the steps can be prevented even in a thin semiconductor wafer having a thickness of 200 µm or less.

Best Mode for Carrying Out the Invention

This invention is described in detail below. In a method of producing a semiconductor wafer to which the protecting method for the semiconductor wafer according to this invention is applied, as described above, the first step of adhering the surface protecting adhesive film for the semiconductor wafer to the circuit-formed surface (hereinafter referred to as a surface) of the semiconductor wafer and the second step of processing the non-circuit-formed surface (hereinafter referred to as a back surface) of the semiconductor wafer are first performed in sequence, and the third step of adhering the bonding film for die bonding to the back surface of the semiconductor wafer without peeling the surface protecting adhesive film is then performed. The subsequent steps are not particularly limited. For example, a method of producing a semiconductor wafer is mentioned in which a step of peeling a surface protecting adhesive film for a semiconductor wafer, a dicing step of dividing and cutting the semiconductor wafer, a molding step of sealing the semiconductor chip with a resin for protecting the outer portion, and the like are performed in sequence.

To begin with, the protecting method for the semiconductor wafer in this invention is described in detail below. In the protecting method for the semiconductor wafer in this invention, the step of adhering the surface protecting adhesive film for the semiconductor wafer to the surface of the semiconductor wafer and the second step of processing the back surface of the semiconductor wafer are performed in sequence, and the third step of adhering the bonding film for die bonding to the back surface of the semiconductor wafer without peeling the surface protecting adhesive film for the semiconductor wafer is then performed. At this time, an adhesive layer having a storage elastic modulus at 150° C. of at least $1 \times 10^5$ Pa and a thickness of 3 to 100 µm is formed on one surface of a substrate film at least one layer of which is made of a resin having a melting point of 200° C. or more.

With respect to the details of the protecting method for the semiconductor wafer according to this invention, first, the peeling film is peeled from the side of the adhesive layer of the surface protecting adhesive film for the semiconductor wafer (hereinafter abbreviated as a surface protecting adhesive film) to expose the surface of the adhesive layer, and the surface protecting adhesive film is adhered to the surface of the semiconductor wafer through the adhesive layer (first step). Then, the semiconductor wafer is fixed on a chuck table of a back surface processing machine or the like through the substrate film layer of the surface protecting adhesive film to process the back surface of the semiconductor wafer (second step). In the second step, all of a step of grinding the back surface of the semiconductor wafer, a wet etching step and a polishing step may be performed or any one of these steps may be performed. Subsequently, the semiconductor wafer is transported to the step of adhering the bonding film for die bonding without peeling the surface protecting adhesive film to adhere the bonding film for die bonding (third step). Thereafter, the surface protecting adhesive film is peeled. Further, after peeling the surface protecting adhesive film, treatment such as water washing, plasma washing or the like is applied to the surface of the semiconductor wafer as required.

In general method, in the back surface processing step, a semiconductor wafer having a thickness of 500 to 1,000 µm before grinding back surface has been thinned to 200 to 600 µm depending on a type of a semiconductor chip or the like. On the other hand, by applying the protecting method of this invention, it can be thinned to a thickness of 200 µm or less. In this case, the minimum thickness of the semiconductor wafer is approximately 20 µm. When the semiconductor wafer is thinned to 200 µm or less, it is preferable that a wet etching step or a polishing step is performed subsequently to the back grinding. The thickness of the semiconductor wafer before grinding the back surface is properly determined depending on the diameter, the type or the like of the semiconductor wafer, and the thickness of the semiconductor wafer after grinding the back surface is properly determined depending on the size of the resulting chip, the type of the circuit or the like.

The procedure of adhering the surface protecting adhesive film to the surface of the semiconductor wafer is sometimes manually conducted. However, it is generally conducted with a device, called an automatic laminator, fitted with a rolled surface protecting adhesive film. Examples of such a laminator include models: ATM-1000B, ATM-1100 and TEAM-100 manufactured by Takatori Corporation and model: STL Series manufactured by Teikoku Seiki K. K.

As a back surface grinding method, known grinding methods such as a through-feed method, an in-feed method and the like are employed. In any of these methods, the back surface grinding is usually conducted while cooling a semiconductor wafer and a grindstone by feeding water thereto. After the completion of the back surface grinding, the wet etching and the polishing are conducted as required. The wet etching step and the polishing step are conducted for removing warpage generated on the back surface of the semiconductor wafer, further thinning the semiconductor wafer, removing an oxide layer or the like, conducting pretreatment in forming an electrode on the back, and the like. The etching solution is properly selected according to the foregoing purposes.

As a device used in the step of adhering the bonding film for die bonding, for example, model: ATM-8200, DM-800 manufactured by Takatori Corporation are illustrated. As the bonding film for die bonding, a bonding film obtained by coating a varnish made of a mixture of a polyimide resin and a thermosetting resin on a surface of a polyester or polypropylene film to form a bonding layer is mentioned. At this time, the mixture of the polyimide resin and the thermosetting resin may sometimes contain additives as required. The bonding film for die bonding is heat-adhered to the back surface of the semiconductor wafer with a roll to form the semiconductor film with the bonding agent adhered.

After the back surface grinding step, the etching step and the step of adhering the bonding film for die bonding are completed respectively, the surface protecting adhesive film is peeled from the surface of the semiconductor wafer. The series of these steps are sometimes conducted manually, but generally with a device called an automatic peeler. As this automatic peeler, models: ATRM-2000B and ATRM-2100 manufactured by Takatori Corporation, and model: STP series manufactured by Teikoku Seiki K. K. are illustrated. Further, for improving a peeling property, it is preferable to conduct heat-peeling as required.

The surface of the semiconductor wafer after peeling the surface protecting adhesive film is washed as required. Examples of the washing method include wet washing such as water washing, solvent washing or the like, dry washing such as plasma washing or the like, and so forth. In the wet washing, ultrasonic washing may be used in combination. These washing methods are properly selected depending on the contamination condition on the surface of the semiconductor wafer.

Next, the surface protecting adhesive film used in this invention is described below. The surface protecting adhesive film according to this invention is produced by forming an adhesive layer on one surface of the substrate film. For protecting the adhesive layer, a peeling film is usually adhered to the surface of the adhesive layer. In consideration of the adhesion to the surface of the semiconductor wafer through the surface of the adhesive layer exposed when peeling the peeling film, a method in which the adhesive agent coating solution is coated on one surface of the peeling film and dried to form the adhesive layer and the resulting adhesive layer is transferred on one surface of the substrate film is preferable for preventing contamination on the surface of the semiconductor wafer by the adhesive layer.

At least one layer of the substrate film is preferably a heat-resistant film which is made of a resin having a melting point of 200° C. or more. It is more preferably a film made of a resin having a melting point of 250° C. or more. The resin film includes those made of polyesters such as polyethylene terephthalate, polyethylene naphthalate and the like, polyimides, polyether ether ketones, polyether sulfones and mixed resins thereof. Typical commercial products thereof include trade name: Teonex manufactured by Teijin Ltd., trade name: Torlon 4203L manufactured by Mitsubishi Chemical Corporation, and trade names: 45G and 200P manufactured by ICI, and so forth.

When the substrate film of the surface protecting adhesive film has at least one layer of a heat resistant layer which is made of a resin having a melting point of 200° C. or more, it may be laminated with an other film. When the melting point of all layers is less than 200° C., deformation with heat is generated on the surface protecting adhesive film in the step of adhering the bonding film for die bonding, which might break the thinned semiconductor wafer.

For increasing the protecting property in grinding the back surface of the semiconductor wafer, a film made of a resin having a low elastic modulus may be laminated in addition to the heat-resistant film. Examples of the film having the low elastic modulus include resin films made of an ethylene-vinyl acetate copolymer, an ethylene-alkyl acrylate copolymer (alkyl group having 1 to 4 carbon atoms), a low-density polyethylene, an ethylene-α-olefin copolymer (α-olefin having 3 to 8 carbon atoms) and the like. Of these, an ethylene-vinyl acetate copolymer film having the content of the vinyl acetate unit of 5 to 50% by weight is preferable.

A typical method of producing the substrate film is a method in which while extrusion-molding a film having a low elastic modulus with an extruder, it is laminated with a heat-resistant film prepared in advance. For enhancing an adhesion between the film having the low elastic modulus and the heat-resistant film, a bonding layer may newly be formed therebetween. For enhancing the adhesion between the substrate film and the adhesive layer, it is preferable to apply corona discharge treatment, chemical treatment or the like to the surface of the substrate film on which the adhesive layer is formed. The thickness of the overall substrate film is preferably 50 to 350 $\mu$m. When the heat-resistant film and the film having the low elastic modulus are laminated, it is preferable that the thickness of the former layer is 10 to 300 $\mu$m and the thickness of the latter layer is 20 to 300 $\mu$m. More preferably, the thickness of the former layer is 15 to 200 $\mu$m. The film layer having the low elastic modulus is effective for absorbing raised and depressed portions formed by the circuit on the surface of the semiconductor wafer and preventing breakage generated in the step of grinding the back surface of the semiconductor wafer. The substrate film layer on which to form the adhesive agent layer is either on the side of the heat-resistant film or on the side of the film having the low elastic modulus. However, in consideration of the heat-adhering step in the die bonding step or the like, the side of the film having the low elastic modulus is preferable.

In consideration of preventing warpage of the semiconductor wafer thinned to 200 $\mu$m or less, the storage elastic modulus of the substrate film layer made of the resin having the melting point of 200° C. or more is $10^3$ to $10^5$ MPa, preferably $10^3$ to $10^4$ MPa at 0 to 100° C., and 10 to $10^4$ MPa, preferably $10^2$ to $10^3$ MPa at 100 to 300° C.

It is preferable that the adhesive agent forming the adhesive layer of the surface protecting adhesive film according to this invention fully functions as an adhesive agent even under temperature conditions in adhering the bonding film for die bonding. Specific examples thereof include an acrylic adhesive agent, a silicon adhesive agent and the like. The thickness of the adhesive layer is preferably 3 to 100 $\mu$m. In the adhesive agent layer, it is preferable that after peeling the surface protecting adhesive film, contamination due to adhesive transfer or the like does not occur on the circuit-formed surface of the semiconductor wafer.

It is preferable that the adhesive layer is crosslinked with a crosslinking agent having a reactive functional group, a peroxide, radioactive rays or the like at a high density lest the adhesion is increased too much in exposing to high temperatures in the die bonding step of heat adhering the bonding film for die bonding and the contamination on the surface of the semiconductor wafer is increased. Further, in adhering the bonding film for die bonding, it is preferable that even when the heat treatment is conducted under a condition of a temperature of 150° C. or more, insufficient peeling due to the increase in adhesion does not occur and that adhesive transfer does not occur. Accordingly, it is preferable that the adhesive layer has storage elastic modulus at 150° C. of at least $1\times10^5$ Pa. It is more preferable that the adhesive layer has storage elastic modulus at 200° C. of at least $1\times10^5$ Pa. The higher the storage elastic modulus, the better. However, the upper limit is usually $1\times10^8$ Pa.

Moreover, in consideration of preventing warpage of the semiconductor wafer thinned to 200 $\mu$m or less, it is advisable that the ratio of the storage elastic modulus [(G) MPa] and the thickness [(D) $\mu$m] of the substrate film layer made of the resin having the melting point of 200° C. or more meets the relations represented by the following equation (1) at 0 to 100° C. and the following equation (2) at 100 to 300° C.

$$3 \leq G/D \leq 10{,}000 \tag{1}$$

$$0.03 \leq G/D \leq 1{,}000 \tag{2}$$

More preferably, aforementioned ratio meets the relations represented by the following equation (3) at 0 to 100° C. and the following equation (4) at 100 to 300° C.

$$5 \leq G/D \leq 700 \quad (3)$$

$$0.5 \leq G/D \leq 70 \quad (4)$$

As a method of forming the adhesive layer having the foregoing characteristics, a method using an acrylic adhesive agent is mentioned. The adhesive layer is formed by using an acrylic adhesive agent which is an emulsion polymerization copolymer containing a (meth)acrylic acid alkyl ester monomer unit (A), a monomer unit (B) having a functional group capable of reacting with a crosslinking agent and a difunctional monomer unit (C) in specific amounts respectively, and a solution or an emulsion containing a crosslinking agent having two or more functional groups in a molecule for increasing a cohesive force or adjusting an adhesion. In case of using the acrylic adhesive agent in the form of a solution, the acrylic adhesive agent is separated from an emulsion obtained by emulsion polymerization through desalting or the like, re-dissolved in a solvent or the like, and used. The acrylic adhesive agent has quite a high molecular weight, and is, in many cases, less dissolved or not dissolved in a solvent. Therefore, in view of the cost as well, it is preferable to use the acrylic adhesive agent in the form of an emulsion as such.

As the acrylic adhesive agent used in this invention, an acrylic adhesive agent obtained by using an acrylic acid alkyl ester, a methacrylic acid alkyl ester or a mixture thereof as a main monomer [hereinafter referred to as a monomer (A)] and copolymerizing the same with a monomer mixture containing a comonomer having a functional group capable of reacting with a crosslinking agent is mentioned.

Examples of the monomer (A) include an acrylic acid alkyl ester or a methacrylic acid alkyl ester containing an alkyl group having 1 to 12 carbon atoms [these are generally referred to as a (meth)acrylic acid alkyl ester]. Preferable is a (meth)acrylic acid alkyl ester containing an alkyl group having 1 to 8 carbon atoms. Specific examples thereof include methyl acrylate, methyl methacrylate, ethyl acrylate, ethyl methacrylate, butyl acrylate, butyl methacrylate, 2-ethylhexyl acrylate and the like. These may be used either singly or in admixture of two or more. Usually, the amount used of the monomer (A) is preferably in the range of 10 to 98.9% by weight based on the total amount of all the monomers as starting materials of the adhesive agent. More preferably, it is 85 to 95% by weight. By specifying the amount used of the monomer (A) in such a range, a polymer containing 10 to 98.9% by weight, preferably 85 to 95% by weight of the (meth)acrylic acid alkyl ester monomer unit (A) is obtained.

Examples of the monomer (B) forming the monomer unit (B) having the functional group capable of reacting with the crosslinking agent include acrylic acid, methacrylic acid, itaconic acid, mesaconic acid, citraconic acid, fumaric acid, maleic acid, itaconic acid monoalkyl ester, mesaconic acid monoalkyl ester, citraconic acid monoalkyl ester, fumaric acid monoalkyl ester, maleic acidmonoalkyl ester, glycidyl acrylate, glycidyl methacrylate, 2-hydroxyethyl acrylate, 2-hydroxyethyl methacrylate, acrylamide, methacrylamide, tertiary-butylaminoethyl acrylate, tertiary-butylaminoethyl acrylate and the like. Preferable are acrylic acid, methacrylic acid, 2-hydroxylethyl acrylate, 2-hydroxylethyl methacrylate, acrylamide, methacrylamide and the like. One of these may be copolymerized with the main monomer, or two or more thereof may be copolymerized therewith. Generally, it is preferable that the amount used of the monomer (B) having the functional group capable of reacting with the crosslinking agent is in the range of 1 to 40% by weight based on the total amount of all the monomers as starting materials of the adhesive agent. More preferable amount is 1 to 10% by weight. Thus, the polymer having the structural unit (B) with approximately the same composition as the monomer composition is obtained.

Moreover, in order that the adhesive layer fully functions as an adhesive agent even under temperature conditions in processing the back surface of the semiconductor wafer, adhering the bonding film for die bonding and the like, it is advisable to adjust the adhesion or the peeling property. As its approach, it is advisable to consider a crosslinking method of a particulate bulk for maintaining a cohesive force of emulsion particles.

Since the emulsion particles have $1 \times 10^5$ Pa or more even under temperature conditions of 150 to 200° C., it is advisable to improve a crosslinking method to maintain a cohesive force by copolymerizing the difunctional monomer (C). Examples of the monomer to be copolymerized well include allyl methacrylate, allyl acrylate, divinylbenzene, vinyl methacrylate, vinyl acrylate, a material in which, for example, both ends are a diacrylate or a dimethacrylate and a structure of a main chain is propylene glycol [trade names: PDP-200, PDP-400, ADP-200 and ADP-400, manufactured by Nippon Oils and Fats Co., Ltd.], tetramethylene glycol [trade names: ADT-250 and ADT-850, manufactured by Nippon Oils and Fats Co., Ltd.] or a mixture thereof [trade names: ADET-1800 and ADPT-4000, manufactured by Nippon Oils and fats Co., Ltd.], and the like.

When the difunctional monomer (C) is emulsion-copolymerized, the amount used thereof is preferably 0.1 to 30% by weight, more preferably 0.1 to 5% by weight based on all the monomers. Thus, a polymer having the structural unit (C) with the composition which is approximately equal to the monomer composition is obtained.

In addition to the main monomer constituting the adhesive agent and the comonomer having the functional group capable of reacting with the crosslinking agent, a specific comonomer having a property as a surfactant (hereinafter referred to as a polymerizable surfactant) may be copolymerized. The polymerizable surfactant has a property of being copolymerized with a main monomer and a comonomer and also serves as an emulsifying agent in emulsion polymerization. In case of using an acrylic adhesive agent obtained by emulsion polymerization using a polymerizable surfactant, contamination on a surface of a semiconductor wafer due to a surfactant does not usually occur. Further, even when slight contamination occurs due to an adhesive agent layer, it can easily be eliminated by washing the surface of the semiconductor wafer with water.

Examples of such a polymerizable surfactant include polyoxyethylene nonylphenyl ether with a polymerizable 1-propenyl group introduced in a benzene ring [trade names: Aquaron RN-10, Aquaron RN-20, Aquaron RN-30, Aquaron RN-50 and the like, manufactured by Daiichi Kogyo Seiyaku Co., Ltd.], ammonium salt of sulfuric acid ester of polyoxyethylene nonylphenyl ether with a polymerizable 1-propenyl group introduced inabenzene ring [trade names: Aquaron HS-10, Aquaron HS-20 and the like, manufactured by Daiichi Kogyo Seiyaku Co., Ltd.], and sulfosuccinic acid diester series having a polymerizable double bond in a molecule [trade names: Latemul S-120A, Latemul S-180A and the like, manufactured by Kao Corporation]. Further, a monomer having a polymerizable double bond, such as vinyl acetate, acrylonitrile, styrene or the like may be copolymerized as required.

Examples of the polymerization reaction mechanism of the acrylic adhesive agent include radical polymerization, anionic polymerization, cationic polymerization and the like. Considering the production cost of the adhesive agent, the influence of the functional groups of the monomers, the influence of ions on the surface of the semiconductor wafer and the like, the polymerization by radical polymerization is preferable. Examples of the radical polymerization initiator in the polymerization by the radical polymerization reaction include organic peroxides such as benzoyl peroxide, acetyl peroxide, isobutyl peroxide, octanoyl peroxide, di-tert-butyl peroxide, di-tert-amyl peroxide and the like, inorganic peroxides such as ammonium persulfate, potassium persulfate, sodium persulfate and the like, and azo compounds such as 2,2'-azobisisobutyronitrile,
2,2'-azobis-2-methylbutyronitrile,
4,4'-azobis-4-cyanovaleric acid and the like.

In the polymerization by the emulsion polymerization method, among these radical polymerization initiators, water-soluble inorganic peroxides such as ammonium persulfate, potassium persulfate, sodium persulfate and the like, and also water soluble azo compounds having a carboxyl group in a molecule, such as 4,4'-azobis-4-cyanovaleric acid and the like are preferable. In consideration of the influence of ions on the surface of the semiconductor wafer, ammonium persulfate and azo compounds having a carboxyl group in a molecule, such as 4,4'-azobis-4-cyanovaleric acid and the like are more preferable. Azo compounds having acarboxyl group inamolecule, such as 4,4'-azobis-4-cyanovaleric acid and the like are most preferable.

The crosslinking agent having two or more crosslinkable functional groups in a molecule, which is used in this invention, is used to be reacted with the functional group of the acrylic adhesive agent for adjusting an adhesion and a cohesive force. Examples of the crosslinking agent include epoxy compounds such as sorbitol polyglycidyl ether, polyglycerol polyglycidyl ether, pentaerythritol polyglycidyl ether, diglycerol polyglycidyl ether, glycerol polyglycidyl ether, neopentylglycol diglycidyl ether, resorcin diglycidyl ether and the like, isocyanate compounds such as tetramethylene diisocyanate, hexamethylene diisocyanate, trimethyloipropane toluene diisocyanate 3-addition product, polyisocyanate and the like, aziridine compounds such as trimethylolpropane-tri-β-aziridinyl propionate, tetramethylolmethane-tri-β-aziridinyl propionate, N,N'-diphenylmethane-4,4'-bis(1-aziridinecarboxyamide), N,N'-hexamethylene-1,6-bis(1-aziridinecarboxyamide), N,N'-toluene-2,4-bis( 1-aziridinecarboxyamide), trimethylolpropane-tri-β-(2-methylaziridine) propionate and the like, tetrafunctional epoxy compounds such as N,N,N',N'-tetraglycidyl-m-xylenediamine, 1,3-bis(N,N'-diglycidylaminomethyl)cyclohexane, and melamine compounds such as hexamethoxymethylolmelamine and the like. These may be used either singly or in admixture of two or more.

Usually, the content of the crosslinking agent is preferably in such a range that the number of functional groups in the crosslinking agent is not larger than the number of functional groups in the acrylic adhesive agent. However, when a functional group is newly generated in the crosslinking reaction or when the crosslinking reaction proceeds slowly, the crosslinking agent may be contained in a larger amount as required. The preferable content of the crosslinking agent is 0.1 to 15 parts by weight per 100 parts by weight of the acrylic adhesive agent. When the content is too low, sometimes, the cohesive force of the adhesive agent layer is insufficient, and the elastic modulus is less than $1 \times 10^5$ Pa at 150 to 200° C., reducing a heat resistance. Accordingly, sometimes, adhesive transfer due to the adhesive agent layer tends to occur, the adhesion is increased, the peeling trouble happens in an automatic peeler when peeling the surface protecting adhesive film from the surface of the semiconductor wafer, and the semiconductor wafer is completely broken. When the content is too much, sometimes, the adhesion between the adhesive layer and the surface of the semiconductor wafer is decreased, with the result that water or dust is entered between the surface of the semiconductor wafer and the adhesive layer in the step of grinding the back surface of the semiconductor wafer, and breakage of the semiconductor wafer or contamination of the surface of the semiconductor wafer occurs.

The adhesive agent coating solution used in this invention may properly contain, in addition to the acrylic adhesive agent and the crosslinking agent obtained by copolymerizing the specific difunctional monomer, tackifiers for adjusting a tackiness, such as rosin resins, terpene resins and the like, various surfactants and the like to such an extent that the aim of this invention is not influenced. Moreover, when the coating solution is an emulsion, film-forming agents such as ethylene glycol monoalkyl ethers and the like may properly be added to such an extent that the aim of this invention is not influenced. Diethylene glycol monoalkyl ethers and their derivatives used as film-forming agents, when present in large amounts in the adhesive layer, might contaminate the surface of the semiconductor wafer to such an extent that washing is impossible. For this reason, it is advisable that materials which are volatilized at a drying temperature of the adhesive agent coating solution are used to minimize the residual amounts of these in the adhesive agent layer.

The adhesion of the surface protecting adhesive film in this invention can properly be adjusted in consideration of the processing conditions of the semiconductor wafer, the diameter of the semiconductor wafer, the thickness of the semiconductor wafer after grinding the back surface, the adhesion temperature of the bonding film for die bonding and the like. When the adhesion is too low, it is, sometimes, difficult to adhere the surface protecting adhesive film to the surface of the semiconductor wafer, and a protecting property of the surface protecting adhesive film becomes insufficient, whereby the semiconductor wafer is broken or the surface of the semiconductor wafer is contaminated with grinding dusts or the like. Further, when the adhesion is too high, a peeling workability might be decreased such that a peeling trouble occurs in an automatic peeler in peeling the surface protecting adhesive film from the surface of the semiconductor wafer after performing the back processing of the semiconductor wafer, or the semiconductor wafer might be broken. Usually, the adhesion is 5 to 500 g/25 mm, preferably 10 to 300 g/25 mm in terms of an adhesion to an SUS304-BA plate.

As a method of coating the adhesive agent coating solution on one surface of the substrate film or the peeling film, known coating methods such as a roll coater method, a reverse roll coater method, a gravure roll method, a bar coating method, a comma coater method, a die coater method or the like can be applied. The conditions for drying the coated adhesive agent are not particularly limited. Generally, it is preferable to dry the same in a temperature range of 80 to 200° C. for 10 seconds to 10 minutes. It is more preferable to dry the same at 80 to 170° C. for 15 seconds to 5 minutes. For satisfactorily expediting the crosslinking reaction of the crosslinking agent and the adhesive agent, the surface protecting adhesive film may be heated at 40 to 80° C. for 5 to 300 hours after the drying of the adhesive agent coating solution is completed.

The method of producing the surface protecting adhesive film for the semiconductor wafer in this invention is as described above. In view of preventing the contamination on the surface of the semiconductor wafer, it is preferable that the atmosphere of producing all the starting materials such as the substrate film, the peeling film, the adhesive agent and the like and the atmosphere of preparing, storing, coating and drying the adhesive agent coating solution are maintained at a cleanliness of class 1,000 or less regulated in U.S. Federal Standard 209b.

The semiconductor wafer to which the protecting method for the semiconductor wafer in this invention can be applied includes a silicon wafer as well as wafers of germanium, gallium-arsenic, gallium-phosphorus, gallium-arsenic-aluminum and the like.

EXAMPLES

This invention is illustrated more specifically below by referring to Examples. In all of Examples and Comparative Examples demonstrated below, preparation and coating of an adhesive agent coating solution, back grinding of a semiconductor silicon wafer, adhesion of a bonding film for die bonding and the like were performed in atmospheres maintained at a cleanliness of class 1,000 or less regulated in U.S. Federal Standard 209b. This invention is not limited to these Examples. Various properties described in Examples were measured by the following methods.

1. Methods of Measuring Various Properties 1-1. Measurement of an Adhesion (g/25 mm)

An adhesion is tall measured according to a method regulated in JIS Z-0237-1991 except for conditions defined below. Each of adhesive films obtained in Examples and Comparative Examples is adhered to a surface of an SUS304-BA plate of 5 cm×20 cm (regulated in JIS G-4305-1991) through its adhesive agent layer in an atmosphere of 23° C., and allowed to stand for 60 minutes. One end of the sample is held and the sample is peeled from the surface of the SUS304-BA plate at a peel angle of 180° and a peel rate of 300 mm/min. At this time, a stress is measured, and calculated with a width of 25 mm.

1-2. Storage Elastic Modulus (Pa)

1) Adhesive Layer

A portion of an adhesive layer of a surf ace protecting adhesive film for a semiconductor wafer is laminated to a thickness of 1 mm to prepare a sample for measuring a viscoelasticity having a diameter of 8 mm. A storage elastic modulus is measured at 150° C. and 200° C. using a dynamic viscoelasticity measuring device (model: RMS-800, manufactured by Rheometrics Inc.). A measurement frequency is 1 Hz, and a warpage is 0.1 to 3%.

2) Substrate Film Layer

A portion of a substrate film layer of a surf ace protecting adhesive film for a semiconductor wafer is cut to prepare a rectangular sample (machine direction: 3 mm, direction perpendicular to a machine direction: 40 mm). A storage elastic modulus (machine direction) at 0 to 300° C. is measured using a dynamic viscoelasticity measuring device (model: RSA-II, manufactured by Rheometrics Inc.). A measurement frequency is 1 Hz, and a warpage is 0.01 to 0.1%. In case of a laminated substrate film, respective layers were measured independently.

1-3. Evaluation of a Contamination

A sample of surface protecting adhesive film is adhered to a whole surface of a semiconductor silicon wafer (diameter: 8 in, thickness: 600 μm, depth of a scribe line: 8 μm, width of a scribe line: 100 μm) through its adhesive layer, and subjected to a back processing step of the semiconductor wafer and a step of adhering a bonding film for die bonding. The surface protecting adhesive film is then peeled (model: HR8500II, manufactured by Nitto Seiki Inc.). Thereafter, the surface of the semiconductor wafer is observed with a laser focus microscope (models: VF-7510, VF-7500 and VP-ED100, manufactured by KEYENCE co. ) at 250× magnification. The evaluation standard is as follows.

o: No adhesive transfer x: Adhesive transfer occurs.

1-4. Breakage of a Semiconductor Wafer (Number of Sheets)

The number of broken semiconductor wafers in a step of grinding a back surface of a semiconductor wafer, a step of adhering a bonding film for die bonding and a step of peeling a surface protecting adhesive film is described.

2. Preparation Examples of a Surface Protecting Adhesive Film 2-1. Preparation Example 1 of a Substrate Film As a heat-resistant film, a polyethylene naphthalate (melting point 269° C.) film (thickness 50 μm, storage elastic modulus at 50° C. 2,800 MPa, storage elastic modulus at 200° C. 190 MPa) was selected. This was laminated with an ethylene-vinyl acetate copolymer (Shore D hardness 35, melting point 85° C., storage elastic modulus at 50° C. 14.5 MPa) film (thickness 70 μm) having a low elastic modulus. Corona discharge treatment was applied to the side of the film having the low elastic modulus on which to form an adhesive layer to prepare a substrate film having a total thickness of 120 μm.

2-2. Comparative Preparation Example 1 of a Substrate Film

A single layer film (thickness 120 μm, storage elastic modulus at 50° C. 14.5 MPa) of an ethylene-vinyl acetate copolymer resin (Shore D hardness 35, melting point 85° C.) having a low elastic modulus was designated a substrate film 2. Corona discharge treatment was applied to the side on which to form an adhesive layer.

2-3. Comparative Preparation Example 2 of a Substrate Film

As a heat-resistant film, a polypropylene (melting point 160° C.) film (thickness 50 μm, storage elastic modulus at 50° C. 1,300 MPa) was selected. This was laminated with an ethylene-vinyl acetate copolymer (Shore D hardness 35, melting point 85° C.) film (thickness 70 μm, storage elastic modulus at 50° C. 14.5 MPa) having a low elastic modulus. Corona discharge treatment was applied to the side of the film having the low elastic modulus on which to form an adhesive layer to prepare a substrate film 3 having a total thickness of 120 μm.

2-4. Comparative Preparation Example 3 of a Substrate Film

As a heat-resistant film, a polymethylpentene (melting point 230° C.) film (thickness 300 μm, storage elastic modulus at 50° C. 100 MPa, storage elastic modulus at 200° C. 5 MPa) was selected. This was laminated with an ethylene-vinyl acetate copolymer (Shore D hardness 35, melting point 85° C.) film (thickness 50 μm, storage elastic modulus at 50° C. 14.5 MPa), having a low elastic modulus. Corona discharge treatment was applied to the side of the film having the low elastic modulus on which to form an adhesive layer to prepare a substrate film 4 having a total thickness of 350 μm.

2-5. Preparation Example 1 of an Adhesive Agent

A polymerization reaction vessel was charged with 150 parts by weight of deionized water, 0.625 part by weight of 4,4'-azobis-4-cyanovaleric acid (trade name: ACVA, manufactured by Otsuka Chemical Co., Ltd.) as a polymerization initiator, 62.25 parts by weight of 2-ethylhexyl acrylate, 18 parts by weight of n-butyl acrylate and 12 parts by weight of methyl methacrylate as a monomer (A), 3 parts by weight of 2-hydroxyethyl methacrylate, 2 parts by weight of methacrylic acid and 1 part by weight of acrylamide as a monomer (B), 1 part by weight of polytetramethylene glycol diacrylate (trade name: ADT-250, manufactured by Nippon Oils And Fats Co., Ltd.) as a monomer (C), and 0.75 part by weight of ammonium salt of sulfuric acid ester of polyoxyethylene nonylphenyl ether (average number of molecules added of ethylene oxide: approximately 20) with a polymerizable 1-propenyl group introduced in a benzene ring (trade name: Aquaron HS-10, manufactured by Daiichi Kogyo Seiyaku Co., Ltd.) as a water-soluble comonomer. Emulsion polymerization was performed with stirring at 70 to 72° C. for 8 hours to obtain an acrylic resin emulsion. This was neutralized with 9% by weight aqueous ammonia (pH=7.0) to form an acrylic adhesive agent (adhesive agent 1) having a solid content of 42.5% by weight.

2-6. Preparation Example 2 of an Adhesive Agent

A polymerization reaction vessel was charged with 150 parts by weight of deionized water, 0.625 part by weight of 4,4'-azobis-4-cyanovaleric acid (trade name: ACVA, manufactured by Otsuka Chemical Co., Ltd.) as a polymerization initiator, 62.25 parts by weight of 2-ethylhexyl acrylate, 18 parts by weight of n-butyl acrylate and 12 parts by weight of methyl methacrylate as a monomer (A), 3 parts by weight of 2-hydroxyethyl methacrylate, 2 parts by weight of methacrylic acid and 1 part by weight of acrylamide as a monomer (B), 1 part by weight of allyl methacrylate (manufactured by Wako Pure Chemical Industries Ltd.) as a monomer (C), and 0.75 part by weight of ammonium salt of sulfuric acid ester of polyoxyethylene nonylphenyl ether (average number of molecules added of ethylene oxide: approximately 20) with a polymerizable 1-propenyl group introduced in a benzene ring (trade name: Aquaron HS-10, manufactured by Daiichi Kogyo Seiyaku Co., Ltd.) as a water-soluble comonomer. Emulsion polymerization was performed with stirring at 70 to 72° C. for 8 hours to obtain an acrylic resin emulsion. This was neutralized with 9% by weight aqueous ammonia (pH=7.0) to form an acrylic adhesive agent (adhesive agent 2) having a solid content of 42.5% by weight.

2-7. Comparative Preparation Example 1 of an Adhesive Agent

A polymerization reaction vessel was charged with 150 parts by weight of deionized water, 0.625 part by weight of 4,4'-azobis-4-cyanovaleric acid (trade name: ACVA, manufactured by Otsuka Chemical Co., Ltd.) as a polymerization initiator, 63.25 parts by weight of 2-ethylhexyl acrylate, 18 parts by weight of n-butyl acrylate and 12 parts by weight of methyl methacrylate as a monomer (A), 3 parts by weight of 2-hydroxyethyl methacrylate, 2 parts by weight of methacrylic acid and 1 part by weight of acrylamide as a monomer (B), and 0.75 part by weight of ammonium salt of sulfuric acid ester of polyoxyethylene nonylphenyl ether (average number of molecules added of ethylene oxide: approximately 20) with a polymerizable 1-propenyl group introduced in a benzene ring (trade name: Aquaron HS-10, manufactured by Daiichi Kogyo Seiyaku Co., Ltd.) as a water-soluble comonomer. Emulsion polymerization was performed with stirring at 70 to 72° C. for 8 hours to obtain an acrylic resin emulsion. This was neutralized with 9% by weight aqueous ammonia (pH=7.0) to form an acrylic adhesive agent (adhesive agent 3) having a solid content of 42.5% by weight.

2-8. Preparation Example 1 of an Adhesive Agent Coating Solution

One hundred parts by weight of the adhesive agent 1 obtained in Production Example 1 of an adhesive agent was collected, and further adjusted to pH of 9.5 with the addition of 9% by weight aqueous ammonia. Subsequently, 1.6 parts by weight of an aziridine crosslinking agent (trade name: Chemitight Pz-33, manufactured by Nippon Shokubai Kagaku Kogyo Co., Ltd.) was added to obtain an adhesive agent coating solution 1.

2-9. Preparation Example 2 of an Adhesive Agent Coating Solution

An adhesive agent coating solution 2 was obtained in the same manner as in Production Example 1 of an adhesive agent coating solution except using the adhesive agent 2 obtained in Production Example 2 of an adhesive agent.

2-10. Comparative Preparation Example 1 of an Adhesive Agent Coating Solution

An adhesive agent coating solution 3 was obtained in the same manner as in Production Example 1 of an adhesive agent coating solution except using the adhesive agent 3 obtained in Comparative Production Example 1 of an adhesive agent.

2-11. Preparation Example 1 of an Adhesive Film

The adhesive agent coating solution 1 was coated on a polypropylene film (peeling film, thickness: 50 μm) using a roll coater, and dried at 120° C. for 2 minutes to form an adhesive layer having a thickness of 10 μm. The corona-treated surface of the substrate film 1 was bonded to the adhesive layer, and pressed to transfer the adhesive layer. After the transfer, the product was heated at 60° C. for 48 hours, and then cooled to room temperature to produce a surface protecting adhesive film 1 for a semiconductor wafer. The storage elastic modulus of the adhesive layer was $1.5 \times 10^5$ Pa at 150° C. and $1.3 \times 10^5$ Pa at 200° C. Further, the adhesion was 120 g/25 mm.

2-12. Preparation Example 2 of an Adhesive Film

The adhesive agent coating solution 2 was coated on a polypropylene film (peeling film, thickness: 50 μm) using a roll coater, and dried at 120° C. for 2 minutes to form an adhesive layer having a thickness of 10 μm. The corona-treated surface of the substrate film 1 was bonded to the adhesive layer, and pressed to transfer the adhesive layer. After the transfer, the product was heated at 60° C. for 48 hours, and then cooled to room temperature to produce a surface protecting adhesive film 2 for a semiconductor wafer. The storage elastic modulus of the adhesive layer was $2.5 \times 10^5$ Pa at 150° C. and $1.8 \times 10^5$ Pa at 200° C. Further, the adhesion was 150 g/25 mm.

2-13. Comparative Preparation Example 1 of an Adhesive Film

The adhesive agent coating solution 1 was coated on a polypropylene film (peeling film, thickness: 50 μm) using a roll coater, and dried at 120° C. for 2 minutes to form an adhesive layer having a thickness of 10 μm. The corona-treated surface of the substrate film 2 was bonded to the adhesive layer, and pressed to transfer the adhesive layer. After the transfer, the product was heated at 60° C. for 48 hours, and then cooled to room temperature to produce a surface protecting adhesive film 3 for a semiconductor wafer. The storage elastic modulus of the adhesive layer was $1.5 \times 10^5$ Pa at 150° C. and $1.3 \times 10^5$ Pa at 200° C. Further, the adhesion was 125 g/25 mm.

2-14. Comparative Preparation Example 2 of an Adhesive Film

The adhesive agent coating solution 3 was coated on a polypropylene film (peeling film, thickness: 50 μm) using a roll coater, and dried at 120° C. for 2 minutes to form an adhesive layer having a thickness of 10 μm. The corona-treated surface of the substrate film 1 was bonded to the adhesive layer, and pressed to transfer the adhesive layer. After the transfer, the product was heated at 60° C. for 48 hours, and then cooled to room temperature to produce a surface protecting adhesive film 4 for a semiconductor wafer. The storage elastic modulus of the adhesive layer was $4.5 \times 10^4$ Pa at 150° C. and $4.3 \times 10^4$ Pa at 200° C. Further, the adhesion was 90 g/25 mm.

2-15. Comparative Preparation Example 3 of an Adhesive Film

The adhesive agent coating solution 1 was coated on a polypropylene film (peeling film, thickness: 50 μm) using a roll coater, and dried at 120° C. for 2 minutes to form an adhesive layer having a thickness of 10 μm. The corona-treated surface of the substrate film 3 was bonded to the adhesive layer, and pressed to transfer the adhesive layer. After the transfer, the product was heated at 60° C. for 48 hours, and then cooled to room temperature to produce a surface protecting adhesive film 5 for a semiconductor wafer. The storage elastic modulus of the adhesive layer was $1.5 \times 10^5$ Pa at 150° C. and $1.3 \times 10^5$ Pa at 200° C. Further, the adhesion was 120 g/25 mm.

2-16. Comparative Preparation Example 4 of an Adhesive Film

The adhesive agent coating solution 3 was coated on a polypropylene film (peeling film, thickness: 50 μm) using a roll coater, and dried at 120° C. for 2 minutes to form an adhesive layer having a thickness of 10 μm. The corona-treated surface of the substrate film 4 was bonded to the adhesive layer, and pressed to transfer the adhesive layer. After the transfer, the product was heated at 60° C. for 48 hours, and then cooled to room temperature to produce a surface protecting adhesive film 6 for a semiconductor wafer. The storage elastic modulus of the adhesive layer was $4.5 \times 10^4$ Pa at 150° C. and $4.3 \times 10^4$ Pa at 200° C. Further, the adhesion was 90 g/25 mm.

3. Examples of a Protecting Method for a Semiconductor Wafer 3-1. Example 1 of a Protecting Method A protecting property of the surface protecting adhesive film 1 for the semiconductor wafer was measured. The surface protecting adhesive film 1 for the semiconductor wafer was adhered to a circuit-formed whole surface of each of 20 sheets of a semiconductor silicon wafer (diameter: 8 in, thickness: 600 μm, depth of a scribe line: 8 μm, width of a scribe line: 100 μm). In this state, the back surface of the semiconductor silicon wafer was ground to thin to a thickness of 100 μm in a back surface grinding (model: DFD-2S/8, manufactured by Disco) step. Subsequently, without peeling the surface protecting adhesive film 1 from the circuit-formed surface of the semiconductor silicon wafer, a bonding film for die bonding (trade name: Hi-Attach, manufactured by Hitachi Kasei K. K.) was bonded to the back surface of the semiconductor silicon wafer (model: DM-800, manufactured by Takatori Corporation) at 150° C. Consequently, in all of 20 sheets of the semiconductor wafer, breakage of a semiconductor wafer did not occur in adhering the bonding film. Even in the peeling step (model: HR8500II, manufactured by Nitto Seiki Inc.), breakage of a semiconductor wafer did not occur. Further, contamination due to adhesive transfer or the like was not observed on the surface of the semiconductor wafer after peeling the surface protecting adhesive film. The results obtained are shown in Table 1.

3-2. Example 2 of a Protecting Method

The same method as in Example 1 was performed except using the surface protecting adhesive film 2 for the semiconductor wafer. Consequently, the same results as in Example 1 were obtained. The results obtained are shown in Table 1.

3-3. Comparative Example 1 of a Protecting Method

The surface protecting adhesive film 1 for the semiconductor wafer was adhered to a circuit-formed whole surface of each of 20 sheets of a semiconductor silicon wafer (diameter: 8 in, thickness: 600 μm, depth of a scribe line: 8 μm, width of a scribe line: 100 μm). In this state, the back grinding (model: DFD-2S/8, manufactured by Disco) step was conducted. After thinning to a thickness of 100 μm by back grinding, the surface protecting adhesive film 1 for the semiconductor wafer was peeled. Then, a bonding film for die bonding (trade name: Hi-Attach, manufactured by Hitachi Kasei K. K.) was adhered to the back surface of the semiconductor wafer (model: DM-800, manufactured by Takatori Corporation) at 150° C. Consequently, 15 sheets of the semiconductor wafer was broken in adhering the bonding film, and the bonding film for die bonding could not be adhered. The results obtained are shown in Table 2.

3-4. Comparative Example 2 of a Protecting Method

The same method as in Example 1 was performed except using the surface protecting adhesive film 3 for the semiconductor wafer. As a result, after the bonding film for die bonding was adhered, the substrate film of the surface protecting adhesive film 3 in contact with a chuck table was melted with heat. Accordingly, transportation with an arm from the chuck table was impossible, and the bonding film for die bonding could not be moved to after-curing with the arm. The results obtained are shown in Table 2 (in Table 2, this phenomenon was described as error 1).

3-5. Comparative Example 3 of a Protecting Method

The same method as in Example 1 was performed except using the surface protecting adhesive film 4 for the semiconductor wafer. As a result, insufficient peeling of the surface protecting adhesive film occurred in 15 sheets among 20 sheets of the wafer. With respect to 5 sheets of the semiconductor wafer to which the bonding film for die bonding could be adhered, the surface of the semiconductor wafer after the step of peeling the adhesive film was measured with an optical microscope. Consequently, adhesive transfer occurred on 4 sheets of the semiconductor wafer. The results obtained are shown in Table 2.

3-6. Comparative Example 4 of a Protecting Method

The same method as in Example 1 was performed except using the surface protecting adhesive film 5 for the semiconductor wafer. As a result, after the bonding film for die bonding was adhered, the substrate film of the surface protecting adhesive film 5 in contact with a chuck table was melted with heat. Accordingly, transportation with an arm from the chuck table was impossible, and the bonding film for die bonding could not be moved to after-curing with the arm. The results obtained are shown in Table 2 (in Table 2, this phenomenon was described as error 1).

3-7. Comparative Example 5 of a Protecting Method

The same method as in Example 1 was performed except using the surface protecting adhesive film 6 for the semiconductor wafer. As a result, the warpage of the wafer after the back grinding of the semiconductor wafer was great, and the bonding film for die bonding could not be adhered with an adhesion device of a bonding film for die bonding (model: DM-800, manufactured by Takatori Corporation). The results obtained are shown in Table 2 (in Table 2, this phenomenon was described as error 2).

TABLE 1

|  |  | Example 1 | Example 2 |
|---|---|---|---|
| Surface protecting adhesive film for semiconductor wafer | Substrate film | 1 | 1 |
|  | Adhesive agent | 1 | 2 |
|  | Adhesive film | 1 | 2 |
| Properties of heat-resistant substrate film | Storage elastic modulus [MPa, 50° C.] | 2800 | 2800 |
|  | G/D [MPa/μm, 50° C.] | 56 | 56 |
|  | Storage elastic modulus [MPa, 200° C.] | 190 | 190 |
|  | G/D [MPa/μm, 200° C.] | 3.8 | 3.8 |
| Melting point of heat-resistant substrate film layer [° C.] |  | 269 | 269 |
| Melting point of substrate film layer having low elastic modulus [° C.] |  | 85 | 85 |
| Adhesion of surface protecting adhesive film for semiconductor wafer in adhering film for die bonding |  | Yes | yes |
| Properties of adhesive layer | Storage elastic modulus [Pa, 150° C.] | $1.5 \times 10^5$ | $2.5 \times 10^5$ |
|  | Storage elastic modulus [Pa, 200° C.] | $1.3 \times 10^5$ | $1.8 \times 10^5$ |
|  | Adhesion [g/25 mm] | 120 | 150 |
| Breakage of wafer in step of adhering bonding film for die bonding (number of sheets) |  | 0 | 0 |
| Transportation after step of adhering bonding film for die bonding (number of sheets) |  | OK | OK |
| Insufficient peeling of surface protecting adhesive film for semiconductor wafer (number of sheets) |  | 0 | 0 |
| Contamination of wafer surface (number of sheets) |  | 0 | 0 |

TABLE 2

|  |  | Comparative Example 1 | Comparative Example 2 | Comparative Example 3 | Comparative Example 4 | Comparative Example 5 |
|---|---|---|---|---|---|---|
| Surface protecting adhesive film for semiconductor wafer | Substrate film | 1 | 2 | 1 | 3 | 4 |
|  | Adhesive agent | 1 | 1 | 3 | 1 | 3 |
|  | Adhesive film | 1 | 3 | 4 | 5 | 6 |
| Properties of heat-resistant substrate film | Storage elastic modulus [MPa, 50° C.] | 2800 | 14.5 | 2800 | 1300 | 100 |
|  | G/D [MPa/μm, 50° C.] | 56 | 0.12 | 56 | 26 | 0.3 |
|  | Storage elastic modulus [MPa, 200° C.] | 190 | — | 190 | — | 5 |
|  | G/D [MPa/μm, 200° C.] | 3.8 | — | 3.8 | — | 0.02 |
| Melting point of heat-resistant substrate film layer [° C.] |  | 269 | — | 269 | 160 | 230 |
| Melting point of substrate film layer having low elastic modulus [° C.] |  | 85 | 85 | 85 | 85 | 85 |
| Adhesion of surface protecting adhesive film for semiconductor wafer in adhering film for die bonding |  | no | yes | yes | yes | yes |
| Properties of adhesive layer | Storage elastic modulus [Pa, 150° C.] | $1.5 \times 10^5$ | $1.5 \times 10^5$ | $4.5 \times 10^4$ | $1.5 \times 10^5$ | $4.5 \times 10^4$ |
|  | Storage elastic modulus [Pa, 200° C.] | $1.3 \times 10^5$ | $1.3 \times 10^5$ | $4.3 \times 10^4$ | $1.3 \times 10^5$ | $4.3 \times 10^4$ |
|  | Adhesion [g/25 mm] | 120 | 125 | 90 | 120 | 120 |
| Breakage of wafer in step of adhering bonding film for die bonding (number of sheets) |  | 15 | 0 | 0 | 0 | 0 |
| Transportation after step of adhering bonding film for die bonding (number of sheets) |  | — | error-1 | OK | error-1 | error-2 |
| Insufficient peeling of surface protecting adhesive film for semiconductor wafer (number of sheets) |  | — | — | 15 | — | — |
| Contamination of wafer surface (number of sheets) |  | — | — | 4 | — | — |

What is claimed is:

1. A protecting method for a semiconductor wafer in a step of thinning the semiconductor wafer comprising a first step of adhering a surface protecting adhesive film for a semiconductor wafer to a circuit-formed surface of the semiconductor wafer, a second step of processing a non-circuit-formed surface of the semiconductor wafer to reduce the thickness of the wafer, and a third step of adhering a bonding film for die bonding to the non-circuit-formed surface of the semiconductor wafer, characterized in that the third step is performed without peeling the surface protecting adhesive film from the semiconductor wafer, and a surface protecting adhesive film for a semiconductor wafer in which an adhesive layer having a storage elastic modulus at 150° C. of at least $1\times10^5$ Pa, an adhesion of 5 to 500 g/25 mm and a thickness of 3 to 100 µm is formed on one surface of a substrate film at least one layer of which is made of a resin having a melting point of 200° C. or more.

2. The protecting method for the semiconductor wafer according to claim 1 wherein the second step includes at least one step selected from the group consisting of a back grinding step, a wet etching step and a polishing step.

3. The protecting method for the semiconductor wafer according to claim 1, wherein the thickness of the semiconductor wafer after the second step is 200 µm or less.

4. The protecting method for the semiconductor wafer according to claim 1, wherein the resin having the melting point of 200° C. or more is at least one resin selected from the group consisting of a polyester, a polyimide, a polyether ether ketone and a polyether sulfone.

5. The protecting method for the semiconductor wafer according to claim 1, wherein the thickness of the substrate film layer made of the resin having the melting point of 200° C. or more is 10 to 300 µm.

* * * * *